(12) United States Patent
Haury et al.

(10) Patent No.: US 9,520,832 B2
(45) Date of Patent: Dec. 13, 2016

(54) DEVICE FOR CONNECTING TWO PIECES OF EQUIPMENT VIA AN ETHERNET LINK, AND A DOCKING STATION FOR SUCH A PIECE OF EQUIPMENT

(71) Applicant: SAGEM DEFENSE SECURITE, Boulogne Billancourt (FR)

(72) Inventors: Christian Haury, Boulogne Billancourt (FR); Francois Guillot, Boulogne Billancourt (FR); Jean-Marie Courteille, Boulogne Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 0 days.

(21) Appl. No.: 14/370,297

(22) PCT Filed: Jan. 9, 2013

(86) PCT No.: PCT/EP2013/050320
§ 371 (c)(1),
(2) Date: Jul. 2, 2014

(87) PCT Pub. No.: WO2013/104683
PCT Pub. Date: Jul. 18, 2013

(65) Prior Publication Data
US 2015/0001923 A1      Jan. 1, 2015

(30) Foreign Application Priority Data
Jan. 9, 2012    (FR) ...................................... 12 50211

(51) Int. Cl.
*H02J 3/02* (2006.01)
*H03C 7/00* (2006.01)
(Continued)

(52) U.S. Cl.
CPC ................. *H03C 7/00* (2013.01); *G06F 13/14* (2013.01); *H02J 3/00* (2013.01); *H02J 3/36* (2013.01);
(Continued)

(58) Field of Classification Search
CPC .................................... H04L 12/10; H02J 3/36
(Continued)

(56) References Cited

U.S. PATENT DOCUMENTS

| | | | |
|---|---|---|---|
| 2002/0080010 A1* | 6/2002 | Zhang | H04B 3/542 375/257 |
| 2006/0078093 A1* | 4/2006 | Karam et al. | 379/24 |

(Continued)

OTHER PUBLICATIONS

G. Mendelson "All you need to know about Power over Ethernet (PoE) and the IEEE 802.3af Standard" *PowerDsine, White Paper,* Jun. 2004 pp. 1-24.
(Continued)

*Primary Examiner* — Jared Fureman
*Assistant Examiner* — Alfonso Perez Borroto
(74) *Attorney, Agent, or Firm* — Muncy, Geissler, Olds & Lowe, P.C.

(57) ABSTRACT

A connection device for connecting a first piece of electronic equipment to a second piece of electronic equipment, the device comprising two Ethernet type interfaces that are linked together by an up line and a down line and that are arranged for each of them to be linked to a respective one of the pieces of equipment and to transmit data in differential mode, two power supply modules, each associated with a respective one of the pieces of equipment and wired in common mode between the up and down lines in order to transmit a power supply carrier signal in alternating current, and two secondary transmission modules, each associated with a respective one of the power supply modules and
(Continued)

Figure 1:
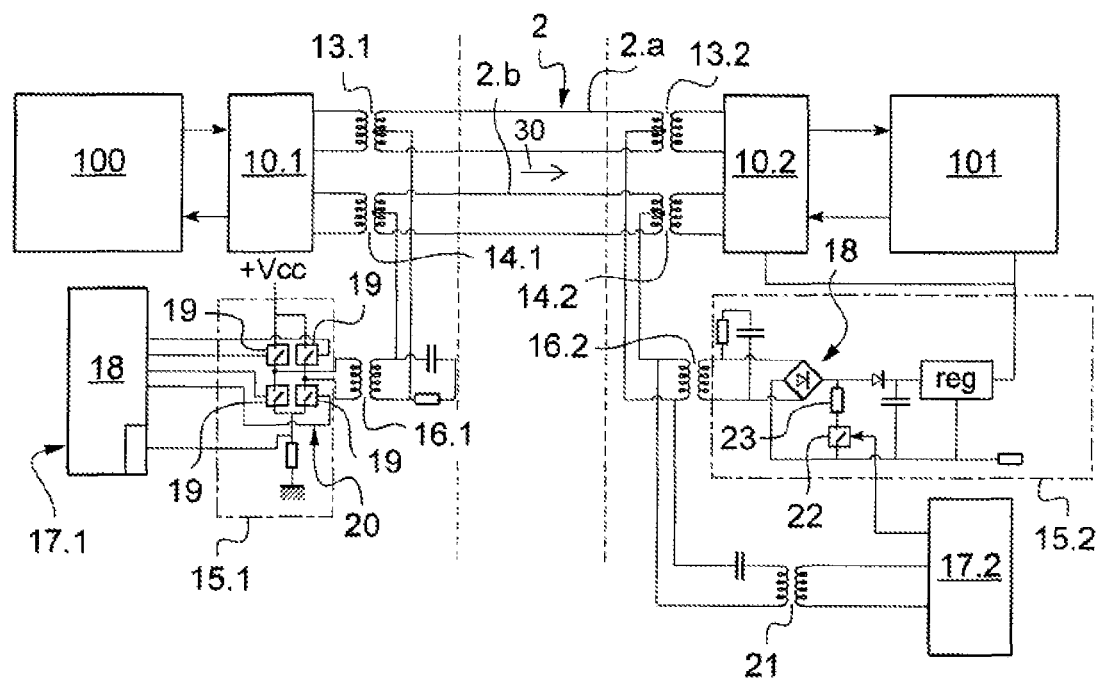

arranged to enable data to be transmitted by modulating the power supply carrier signal.

13 Claims, 1 Drawing Sheet

(51) Int. Cl.
| | |
|---|---|
| *H02J 3/36* | (2006.01) |
| *G06F 13/14* | (2006.01) |
| *H04L 12/10* | (2006.01) |
| *H02J 3/00* | (2006.01) |
| *H04L 27/20* | (2006.01) |
| *H04L 12/721* | (2013.01) |

(52) U.S. Cl.
CPC ............... *H04L 12/10* (2013.01); *H04L 27/20* (2013.01); *H04L 45/66* (2013.01)

(58) Field of Classification Search
USPC .......................................... 307/2; 340/310.16
See application file for complete search history.

(56) References Cited

U.S. PATENT DOCUMENTS

| | | | | |
|---|---|---|---|---|
| 2007/0278857 | A1* | 12/2007 | Robbins | H02J 1/10 307/2 |
| 2007/0296394 | A1* | 12/2007 | Landry et al. | 323/371 |
| 2008/0095218 | A1* | 4/2008 | Murray et al. | 375/150 |
| 2008/0281473 | A1* | 11/2008 | Pitt | 700/291 |
| 2008/0315682 | A1* | 12/2008 | Hussain | H04L 12/10 307/2 |
| 2009/0015237 | A1* | 1/2009 | Vetteth | 324/76.19 |
| 2009/0041004 | A1* | 2/2009 | Emmanuel | 370/352 |
| 2009/0310688 | A1* | 12/2009 | Ikeda | H04B 3/544 375/257 |
| 2010/0078992 | A1* | 4/2010 | Landry et al. | 307/2 |
| 2010/0117808 | A1* | 5/2010 | Karam | 340/310.16 |
| 2012/0235800 | A1* | 9/2012 | Hammerschmidt | 340/12.22 |

OTHER PUBLICATIONS

M. Rahman et al., "Medium Access Control for Power Line Communications: An Overview of the IEEE 1901 and ITU-T G.hn Standards", *IEEE Communications Magazine*, vol. 49, No. 6, Jun. 1, 2011, pp. 183-191.

* cited by examiner

DEVICE FOR CONNECTING TWO PIECES OF EQUIPMENT VIA AN ETHERNET LINK, AND A DOCKING STATION FOR SUCH A PIECE OF EQUIPMENT

The present invention relates to a device for connecting together two pieces of electronic equipment such as computer units, e.g. a server and a terminal or a peripheral.

It is known to connect pieces of electronic equipment together by means of a connection device using an Ethernet link. The connection device has two Ethernet interfaces that are linked together by an up line and a down line and that are each arranged to be linked with a respective one of the pieces of equipment in order to perform data transmission in differential mode. This enables data to be transmitted at a high rate, nowadays conventionally in the range 100 megabits per second (Mb/s) to 1000 Mb/s.

In certain applications, it is necessary to provide a secure link for transmitting sensitive information. Unfortunately, conventional Ethernet links of the above type, by their very principle, provide only a relatively low level of security unless complex modifications are made to the interfaces and the data rate is restricted. Under such circumstances, it is common practice to provide a second link between the pieces of equipment, said second link being established by means of a second connection device associated with the pieces of equipment. Unfortunately, in on-board aviation applications, adding a second connection device is penalizing in terms of weight.

It is also necessary to make provision for coupling equipment to the electricity network, with this being done by means of cables that present weight that is additional to the weight of the connection devices.

An object of the invention is to provide means for linking together pieces of electronic equipment, while presenting the above-mentioned drawbacks little or not at all.

To this end, the invention provides a connection device for connecting a first piece of electronic equipment to a second piece of electronic equipment, the device comprising two Ethernet type interfaces that are linked together by an up line and a down line and that are arranged for each of them to be linked to a respective one of the pieces of equipment and to transmit data in differential mode, two power supply modules, each associated with a respective one of the pieces of equipment and wired in common mode between the up and down lines in order to transmit a power supply carrier signal in alternating current, and two secondary transmission modules, each associated with a respective one of the power supply modules and arranged to enable data to be transmitted by modulating the power supply carrier signal.

Thus, the device of the invention makes it possible to have a data transmission link of the Ethernet type in differential mode over the up and down lines and a data transmission link in common mode over the up and down lines. The connection device also serves to power one of the pieces of equipment via the other piece of equipment. This leads to savings in weight and in volume. The Ethernet link also enables communication to take place over distances that are relatively long.

Preferably, the secondary transmission module of the first piece of equipment is arranged to perform modulation by phase shift keying.

This modulation technique is particularly well adapted to transmitting data to the second piece of equipment.

More preferably, the secondary transmission module of the second piece of equipment is arranged to transmit data by modulating current consumption and, advantageously, the modulation of current consumption is synchronized with the up data stream for coding data as a function of the time positions of peaks in the consumed current relative to the up data stream.

This enables data to be transmitted simply to the first piece of equipment.

In two alternative bidirectional communication techniques:

the transmission modules are arranged to provide bidirectional transmission simultaneously; and
the transmission modules are arranged to provide bidirectional transmission in alternation.

Other characteristics and advantages of the invention appear on reading the following description of particular, non-limiting embodiments of the invention.

Figure 2:
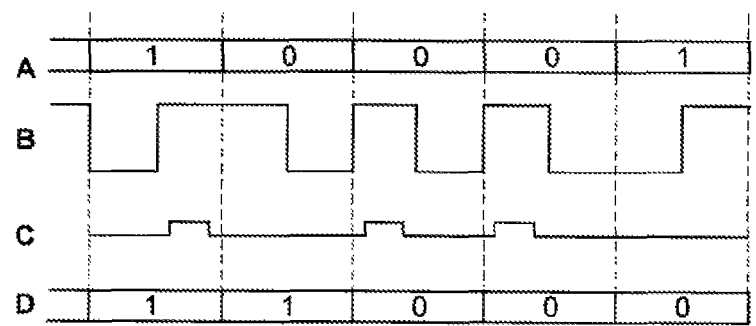

Reference is made to the accompanying drawing, in which:

FIG. 1 is a diagrammatic view of the circuit of a device in accordance with the invention; and FIG. 2 is a diagram showing data transmission timing.

With reference to the figures, the connection device in accordance with the invention is for enabling a first piece of electronic equipment 100, in this example master equipment of the computer server type, to be coupled with a second piece of electronic equipment 101, in this example slave electronic equipment of the computer terminal type. Nevertheless, the invention can be used with other types of communicating electronic equipment.

The pieces of equipment 100 and 101 are both provided with a respective external coupling port of the Ethernet type.

The connection device of the invention, given overall reference 1, comprises a master coupling unit 10.1 and a slave coupling unit 10.2 that are Ethernet interfaces linked together by an Ethernet type link 2 that comprises a transmit line 2.a and a receive line 2.b. The transmit line 2.a and the receive line 2.b are each formed by a respective pair of conductors in an Ethernet cable.

The master coupling unit 10.1 possesses a coupling port external to the piece of equipment 100 and is linked to the transmit line 2.a and to the receive line 2.b via respective isolating transformers 13.1 or 14.1.

The slave coupling unit 10.2 possesses a coupling port external to the equipment 101 and is linked to the transmit line 2.a and to the receive line 2.b via respective isolating transformers 13.2 and 14.2.

The master coupling unit 10.1 is also linked to a power supply module 15.1 wired in common mode between the transmit line 2.a and the receive line 2.b to transmit alternating current (AC) over the link via electrical isolation. The electrical isolation is provided by an isolating transformer 16.1 having its secondary connected to the midpoints of the secondary of the transformer 13.1 and of the secondary of the transformer 14.1.

The power supply module 15.1 is arranged to supply electricity at a frequency that is low enough to avoid disturbing communication and high enough to limit the size of the transformer 16.1. The frequency range that can be used in the present example extends from 2 kilohertz (kHz) to 100 kHz, or else from 2 kHz to 10 kHz. The transformer in this example is preferably arranged to provide electrical isolation (both for direct current (DC), and also for low and high frequency AC) of better than 1500 volts (V).

The power supply module 15.1 thus comprises a DC/AC converter that is isolated for transmitting power over the link 2 and that is associated with a regulator member. The regulator member is arranged to perform servo-control on a root mean square (rms) voltage value and servo-control on a (sinewave) current waveform at the output from a power supply module 15.1 linked to the slave coupling unit 10.2. The servo-control performed on the waveform is provided to limit any risk of electromagnetic disturbances. This serves to avoid power supply faults such as switching noise (or "glitches") that the equipment 101 might not be capable of accommodating and that would require bulky filter elements to be provided at the equipment 101.

The coupling unit 10.2 is connected to the power supply module 15.2, which is wired in common mode between the transmit line 2.*a* and the receive line 2.*b* in order to receive AC over the link via electrical isolation. The electrical isolation is provided by an isolating transformer 16.2 having its primary connected to the midpoints of the primary of the transformer 13.2 and of the primary of the transformer 14.2. The power supply module 15.2 is isolated and thus serves to receive power from the link 2.

The power supply module 15.2 of the peripheral coupling unit comprises a rectifier circuit given overall reference 18 that comprises a diode bridge and a capacitor.

The device of the invention serves to convey a power supply voltage as an AC power supply carrier signal in common mode over the transmit line and the receive line (V+ is conveyed via one of the pairs of the Ethernet cable 2 and the V− is conveyed via the other pair). In an aviation application, it is considered that the maximum level of power that can be transmitted is 30 volts amps (VA) (28 $V_{rms}$ and at least 1 $A_{rms}$ at a frequency in the range 10 kHz to 100 kHz). The power supply signal is regulated on the basis of two parameters: the rms voltage and the waveform of the current. At the source, the rms voltage is measured and the generator is servo-controlled to deliver a predetermined voltage, e.g. 28 V, regardless of the waveform of the current. Servo-control is also performed on the waveform of the current. This comprises more particularly servo-control on a sinusoidal waveform, as mentioned above. This enables the receiver portion to be simplified by limiting electromagnetic disturbances. In particular, the switching noise of the diodes of the diode bridge in the rectifier circuit 18 is limited or eliminated without having resource to bulky filter elements. The frequency selected for the signal, preferably lying in the range 2 kHz to 100 kHz in this example, is low enough to avoid disturbing communication, and high enough to minimize the size of the transformer.

For DC, isolation is provided by the transformers, and for AC capacitive coupling is minimized by the presence of the front-mounted transformers. Capacitive coupling is low within the coupling transformers and it is possible to add common mode inductors in series in each of the lines 2.*a* and 2.*b* in order to compensate for the drop in their impedance at high frequency.

Thus, the computer of the slave electronic equipment is powered by the master electronic equipment. Only the master electronic equipment has a power supply, thereby lightening the structure of the computer system and simplifying its maintenance.

Each power supply module 15.1, 15.2 is associated with a secondary transmission module 17.1, 17.2 for transmitting data by modulating the power supply carrier signal.

The secondary transmission module 17.1 has a control circuit 18 of the microcontroller type or of the field program gate array (FPGA) type that is connected firstly to switches 19 of a power bridge 20 connected to the primary of the transformer 16.1 for data transmission purposes, and secondly to a member for measuring the transmitted current for data reception purposes.

The secondary transmission module 17.2 is connected to the lines 2.*a* and 2.*b* via an isolating transformer 21 in order to receive data. The isolating transformer 21 has a primary connected to the midpoints of the primary of the transformer 13.2 and of the primary of the transformer 14.2, and a secondary connected to the secondary transmission module 17.2. The secondary transmission module 17.2 is also connected to a switch 22 wired between the output branches of the diode bridge in series with a resistor 23.

In operation, the secondary transmission module 17.1 transforms the data A into a biphase stream B (using biphase L coding) and it controls the switches 19 to modulate the voltage of the power supply carrier signal correspondingly.

The secondary transmission module 17.2 synchronizes itself on the biphase stream B and transforms said stream in order to recover the transmitted data.

To transmit data, the secondary transmission module 17.2 uses the data reception clock 30 sent by the secondary transmission module 17.1 in order to synchronize a transmit clock by means of a phase locked loop serving to create a consumption command on the transmitted stream. By acting on the switch 21, the consumption command leads to jumps or peaks of consumption at time positions within each cell that correspond to data. In the example shown in FIG. 2, it can be seen that the consumed current C presents consumption peaks: the consumption peak at the beginning of the cell is of value 0 whereas the consumption peak at the end of the cell is of value 1. The secondary transmission module of the second piece of equipment is thus arranged to transmit data by modulating the consumed current C, with modulation of the consumed current C being synchronized with an up data stream to code data D as a function of time positions of peaks consumed current relative to the up data stream.

On reception, the secondary transmission module 17.1 detects the current consumption peaks. On the basis of measuring current, it is possible, after sampling, to calculate a mean value of the consumed current C and to reveal consumption peaks by means of a differentiator in the time windows or cells in which the peaks are positioned. The data D is then deduced therefrom.

Data is thus transmitted bidirectionally and simultaneously.

Although not shown, filter means are provided, of the lowpass type in this example, to prevent the transmission of data via the secondary transmission modules 17.1, 17.2 disturbing the Ethernet data streams.

Naturally, the invention is not limited to the embodiments described but covers any variant coming within the ambit of the invention as defined by the claims.

In particular, the power supply module 15.2 may be a digital module and may include a power factor correction (PFC) device.

In a variant, the transmission modules are arranged to provide bidirectional transmission in alternation.

The invention claimed is:

1. A connection device for connecting first electronic equipment to second electronic equipment, the device comprising first and second Ethernet type interfaces that are linked together by an up line and a down line and that are arranged for each of them to be linked to a respective one of the first and second electronic equipment and to transmit data in differential mode, first and second power supply modules, each associated with a respective one of the first and second electronic equipment and wired in common mode between the up and down lines in order to transmit a power supply carrier signal in alternating current, and first and second secondary transmission modules, each associated with a respective one of the first and second power supply modules and arranged to enable data to be transmitted by modulating the power supply carrier signal in accordance with a data stream, wherein the second Ethernet type interface is linked to the up and down lines via a first transformer, the second power supply module receives power from a primary of the first transformer via a second transformer, and the second secondary transmission module receives power from a primary of the second transformer and is separately connected to the second power supply module to control the second power supply module for transmitting the power supply carrier signal.

2. The device according to claim 1, wherein the first secondary transmission module of the first electronic equipment is arranged to perform modulation by phase shift keying.

3. The device according to claim 1, wherein the second secondary transmission module of the second electronic equipment is arranged to transmit data by modulating current consumption.

4. A device according to claim 3, wherein the modulation of current consumption is synchronized with an up data stream for coding data as a function of the time positions of peaks in the consumed current.

5. The device according to claim 1, wherein the transmission modules are arranged to provide bidirectional transmission simultaneously.

6. The device according to claim 1, wherein the transmission modules are arranged to provide bidirectional transmission in alternation.

7. A method for transmitting data between a first electronic equipment and a second electronic equipment connected together by a connection device comprising first and second Ethernet type interfaces that are linked together by an up line and a down line linked to a respective one of the first and second electronic equipment, first and second power supply modules, each associated with a respective one of the first and second electronic equipment and wired in common mode between the up and down lines in order to transmit a power supply carrier signal in alternating current, and first and second secondary transmission modules, each associated with a respective one of the first and second power supply modules, wherein the second Ethernet type interface is linked to the up and down lines via a first transformer, the second power apply module receives power from a primary of the first transformer via a second transformer, and the second secondary transmission module receives power from a primary of the second transformer and is separately connected to the second power supply module, said method comprising a step of transmitting data in differential mode through the up line and the down line, a step of generating the power supply carrier signal by controlling the second power supply module by the second secondary transmission module, and a step of transmitting data by modulating the power supply carrier signal in accordance with a data stream, wherein the second secondary transmission module controls the second power supply module.

8. The method according to claim 7, wherein:

the first secondary transmission modules transforms data into a biphase stream modulating the voltage of the power supply carrier signal correspondingly, and the second secondary transmission modules synchronizes itself on the biphase stream and transforms said stream in order to recover the transmitted data.

9. The method according to claim 8, wherein:

to transmit data, the second secondary transmission module modulates a consumed current in the second piece of equipment, with modulation of the consumed current being synchronized with an up data stream to code data as a function of time positions of peaks consumed current, to receive the data, the first secondary transmission module detects the current consumption peaks, and on the basis of the detected current and after sampling, a mean value of the consumed current is calculated for revealing consumption peaks by a differentiator in time windows or cells in which the peaks are positioned in order to deduce the data therefrom.

10. The method according to claim 9, wherein the second secondary transmission module uses a data reception clock sent by the first secondary transmission module in order to synchronize a transmit clock by a phase locked loop serving to create a consumption command on the transmitted stream in such a way the consumption command leads to jumps or peaks of consumption at time positions within cell corresponding to data.

11. The method according to claim 1, wherein:

the first secondary transmission modules transforms data into a biphase stream modulating the voltage of the power supply carrier signal correspondingly, and the second secondary transmission modules synchronizes itself on the biphase stream and transforms said stream in order to recover the transmitted data.

12. The method according to claim 11, wherein:

to transmit data, the second secondary transmission module modulates a consumed current in the second piece of equipment, with modulation of the consumed current being synchronized with an up data stream to code data as a function of time positions of peaks consumed current, to receive the data, the first secondary transmission module detects the current consumption peaks, and on the basis of the detected current and after sampling, a mean value of the consumed current is calculated for revealing consumption peaks by a differentiator in time windows or cells in which the peaks are positioned in order to deduce the data therefrom.

13. The method according to claim 12, wherein the second secondary transmission module uses a data reception clock sent by the first secondary transmission module in order to synchronize a transmit clock by a phase locked loop serving to create a consumption command on the transmitted stream in such a way the consumption command leads to jumps or peaks of consumption at time positions within cell corresponding to data.

* * * * *